US007249296B2

(12) United States Patent
Hirabayashi

(10) Patent No.: US 7,249,296 B2
(45) Date of Patent: Jul. 24, 2007

(54) SEMICONDUCTOR INTEGRATED CIRCUIT

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 10/805,227

(22) Filed: Mar. 22, 2004

(65) Prior Publication Data
US 2005/0160332 A1    Jul. 21, 2005

(30) Foreign Application Priority Data
Jan. 16, 2004    (JP)    ............... 2004-009329

(51) Int. Cl.
*G01R 31/28*    (2006.01)
*G11C 7/00*    (2006.01)
(52) U.S. Cl. ............... 714/718; 714/746; 714/753; 714/758; 714/768; 714/733; 714/734; 714/743; 365/201
(58) Field of Classification Search ............ None
See application file for complete search history.

(56) References Cited
U.S. PATENT DOCUMENTS
4,680,760 A * 7/1987 Giles et al. ............ 714/718

5,509,132 A * 4/1996 Matsuda et al. ............ 711/3
6,910,169 B2 * 6/2005 Sharma ............ 714/753

OTHER PUBLICATIONS

C. L. Chen, et al., "Error-Correcting Codes for Semiconductor Memory Applications: A State-of-the-Art Review", IBM J. Res. Develop, vol. 28, No. 2, Mar. 1984, pp. 124-134.

* cited by examiner

*Primary Examiner*—Guy Lamarre
*Assistant Examiner*—Steven D. Radosevich
(74) *Attorney, Agent, or Firm*—Oblon, Spivak, McClelland, Maier & Neustadt, P.C.

(57) ABSTRACT

An ECC circuit has an error correction function of N (N is a natural number) bits for output data of a memory cell array. A BIST circuit reads background data out of test target addresses, and writes/reads inverted data of the background data in at least a part of the testing target addresses. An N+1 bit error detection circuit outputs a signal indicative of test NG (defective product) when a total of error bit numbers n1 and n2 detected by the ECC circuit during first and second readings exceeds N.

19 Claims, 8 Drawing Sheets

FIG. 10

Testing target address ... Data bit (n bit): 0 1 2 3 4 5 6 7    Code bit (m bit): a b c d e Data pattern
1) 10101010 → 1 0 1 0 1 0 1 0   1 0 1 0 1
2) 01010101 → 0 1 0 1 0 1 0 1   1 0 0 1 1

↑↑↑↑↑↑↑↑   ↑↑
Checking target bit   Checking target bit

※ In test 2, addresses a, b, e are not checked

FIG. 11

Testing target address ... Data bit (n bit): 0 1 2 3 4 5 6 7

Data pattern
1) 1010**** → 1 0 1 0 1 1 1 1
2) 0101**** → 0 1 0 1 1 1 1 1

↑↑↑↑↑↑↑↑
Checking target bit

※ Addresses 4, 5, 6, 7 are not tested

SEMICONDUCTOR INTEGRATED CIRCUIT

CROSS-REFERENCE TO RELATED APPLICATIONS

This application is based upon and claims the benefit of priority from prior Japanese Patent Application No. 2004-009329, filed Jan. 16, 2004, the entire contents of which are incorporated herein by reference.

BACKGROUND OF THE INVENTION

1. Field of the Invention

The present invention is directed to a semiconductor integrated circuit, and particularly, it is applied to a memory on which an error correcting code (ECC) circuit is utilized.

2. Description of the Related Art

Miniaturization of elements with progress of semiconductor device technology has caused, for example, a reduction in a storage node capacity of a cell that stores data. Consequently, a soft error of data has become a big problem.

Thus, in recent years, an ECC circuit has frequently been utilized as countermeasures of such a soft error.

The memory on which the ECC circuit is utilized has a section for storing data bits as normal data and a section for storing code bits used to detect errors. A data bit error is detected based on a code bit. If an error is detected, a bit in which the error occurs is further checked to execute error correction.

Error correction and detection capabilities of the ECC circuit are decided by the number of code bits. Generally, most of ECC circuits have 1-bit error correction functions and 2-bit error detection functions. In this case, single error correction-double error detection (SEC-DED) codes are used as code bits.

Meanwhile, in the system LSI chip, the built-in self test (BIST) circuit is often utilized in order to test defectiveness/nondefectiveness of the memory. The BIST circuit functions to write/read a test pattern in/from the memory, and to detect a defect of a cell by comparing read-out data as a memory output with written data as an expected value.

As the test pattern, a so-called marching pattern is widely used by taking a Stack-at-fault rate, testing time, a circuit size etc., into consideration.

A test algorithm (basic operation) by the marching pattern is as follows.

(1) First, background data are written in all the cells (all the addresses) that constitute the memory. As the background data, for example, repeated data [1010 . . . ], [0101 . . . ], identical data [1111 . . . ], [0000 . . . ] etc., are used.

(2) Next, a testing target address (first address) is specified, and data is read out of the testing target address. Then, the read-out data is compared with the background data (expected value) to test the testing target address.

(3) Subsequently, inverted data of the background data is written/read in/from the testing target address. For example, the inverted data becomes [0101 . . . ] if the background data is [1010 . . . ], and [0000 . . . ] if the background data is [1111 . . . ]. The read-out data is then compared with the inverted data (expected value) to test the testing target address.

Subsequently, the operations (2) and (3) are repeated while the testing target addresses are changed. When all the addresses are tested, the testing operation is finished.

FIG. 1 shows an example of a conventional semiconductor integrated circuit comprising a memory on which an ECC circuit is utilized and a BIST circuit.

A data bit as normal data and a code bit for error detection are stored in a memory cell array 11. During testing, a data bit is generated at, e.g., the BIST circuit 13, and a code bit is generated at, e.g., the ECC circuit 12 based on the data bit.

The read-out data as the memory output is subjected to error correction by the ECC circuit 12, and then transferred to the BIST circuit 13. Assuming that the ECC circuit 12 has a 1-bit error correction function, even if there is a 1-bit defect (cell failure or the like) in the testing target address, the defect can be corrected. Thus, such a defect can be permitted.

That is, in the BIST circuit 13, since the read-out data that has been subjected to the error correction by the ECC circuit 12 is compared with the background data (expected value), both data are equal to each other when there is a defect not exceeding one bit in the testing target address, and a result of the testing determines a product to be nondefective.

On the other hand, when there is a defect of two bits or more (cell failure or the like) in the testing target address, this defect cannot be corrected by the ECC circuit 12 that has the 1-bit error correction function. Thus, in the BIST circuit 13, complete coincidence is not determined between the read-out data and the background data (expected value), and a result of the testing determines a product to be defective.

However, in the conventional test carried out by generating the marching pattern at the BIST circuit 13, a defective bit may not be accurately detected in the testing target address. In this case, there is a problem that a defective product may be determined as nondefective.

This problem is specifically described below.

It is assumed that an ECC circuit that has a 1-bit error correction function and a 2-bit error detection function is utilized in a memory to be tested.

To begin with, consideration is given to a case in which [1010 . . . ] is written as background data in all the addresses of the memory.

As shown in FIG. 2, testing target addresses 0, 1, 2, . . . 7 are specified after the background data is written, and 8-bit data is read out of the testing target addresses 0, 1, 2, . . . 7. It is assumed here that among the testing target addresses 0, 1, 2, . . . 7, a bit of the address 5 is a Stack-at-one fault (always "1") and a bit of the address 7 is a Stack-at-zero fault (always "0").

In this case, as shown in 1) of the drawing, the Stack-at-zero fault of the address 7 cannot be detected while the Stack-at-one fault of the address 5 can be detected. That is, since the ECC circuit detects only the 1-bit error of the address 5 to correct the error, the BIST circuit determines a product to be nondefective even if the product is defective.

Subsequently, as shown in 2) of the drawing, writing/reading of inverted data [0101 . . . ] of the background data is executed in the testing target addresses 0, 1, 2, . . . 7.

In this case, the Stack-at-one fault of the address 5 cannot be detected while the Stack-at-zero fault of the address 7 can be detected. That is, since the ECC circuit detects only the 1-bit error of the address 7 to correct the error, the BIST circuit determines a product to be nondefective even if the product is defective.

Similarly, consideration is given to a case in which [1111 . . . ] is written as background data in all the addresses of the memory. Conditions are similar to those of the above example.

When 8-bit data is read out of the testing target addresses 0, 1, 2, . . . 7, as shown in 3) of the drawing, the Stack-at-one fault of the address 5 cannot be detected while the Stack-at-zero fault of the address 7 can be detected. That is, since the ECC circuit detects only the 1-bit error of the address 5 to correct the error, the BIST circuit determines a product to be nondefective even if the product is defective.

Subsequently, as shown in 4) of the drawing, writing/reading of inverted data [0000 . . . ] of the background data is executed in the testing target addresses 0, 1, 2, . . . 7.

In this case, the Stack-at-zero fault of the address 7 cannot be detected while the Stack-at-one fault of the address 5 can be detected. That is, since the ECC circuit detects only the 1-bit error of the address 5 to correct the error, the BIST circuit determines a product to be nondefective even if the product is defective.

Therefore, if the testing is executed by using the marching pattern even while there are Stack-at-2 bit faults in the testing target addresses 0, 1, 2, . . . 7, the ECC circuit cannot detect the Stack-at-2 bit faults simultaneously. Consequently, the BIST circuit mistakenly determines the product that has the Stack-at-2 bit faults in the testing target addresses 0, 1, 2, . . . 7 to be nondefective.

Incidentally, such a problem can be solved by increasing kinds of data patterns used for testing. That is, if there are Stack-at-faults a number of which exceeds the correction capability of the ECC circuit in the testing target addresses 0, 1, 2, . . . 7, testing can be carried out by using data patterns that enable sure detection of all the Stack-at-faults.

However, if the testing is carried out by increasing kinds of test patterns as described above, problems of increases in complexity and area of the BIST circuit, testing time etc., inevitably occur.

BRIEF SUMMARY OF THE INVENTION

A semiconductor integrated circuit regarding an aspect of the present invention comprises a memory; an ECC circuit that has an error correction function of N (N is a natural number) bits for output data of the memory; and an error detection circuit configured to output a signal indicative of the following fact, if a total of an error bit number n1 detected by the ECC circuit when a first data pattern in testing target addresses of the memory is read out and an error bit number n2 detected by the ECC circuit when a second data pattern that is an inversion of the first data pattern in at least a part of the testing target addresses is read out exceeds N.

BRIEF DESCRIPTION OF THE SEVERAL VIEWS OF THE DRAWING

FIG. 10 is a view showing an example of checking target bits in the test method 2;

FIG. 11 is a view showing an example of checking target bits in the test method 2;

DETAILED DESCRIPTION OF THE INVENTION

A semiconductor integrated circuit of an aspect of the present invention will be described below in detail with reference to the accompanying drawing.

1. Overview

An example of the present invention is applied to a test circuit for testing a memory on which an ECC circuit is utilized. For example, when a BIST circuit is used as a test circuit and a marching pattern is generated by the BIST circuit to execute testing, if an error correction capability of the ECC circuit is N (N is a natural number) bits, defects (Stack-at-faults or the like) in testing target addresses can be permitted up to N bits.

In other words, when the error correction capability of the ECC circuit is N bits, if defects (Stack-at-faults or the like) in the testing target addresses exceed N bits, the defects cannot be corrected by the ECC circuit. Thus, a product must be determined as defective.

However, in the test that uses the marching pattern widely employed in the BIST circuit, even if there are defects exceeding the N bits in the testing target addresses, all the defects cannot be detected simultaneously. Consequently, a product that must be determined as defective may be determined as nondefective.

Thus, according to the example of the invention, basic units of a marching operation are (1) reading of background data (first data pattern) and (2) writing/reading of inverted data (second data pattern) of the background data, and defectiveness/nondefectiveness of a product is determined based on whether a total of an error bit number n1 detected by the ECC circuit during the reading of (1) and an error bit number n2 detected by the ECC circuit during the reading of (2) exceeds N or not.

Such a constitution enables sure detection of all defects in the testing target addresses. Therefore, accuracy of defect detection by the test circuit can be improved without any increases in complexity and area of the test circuit, and testing time etc.

2. First Embodiment

Next, a semiconductor integrated circuit according to a first embodiment of the present invention will be described.

Figure 1:
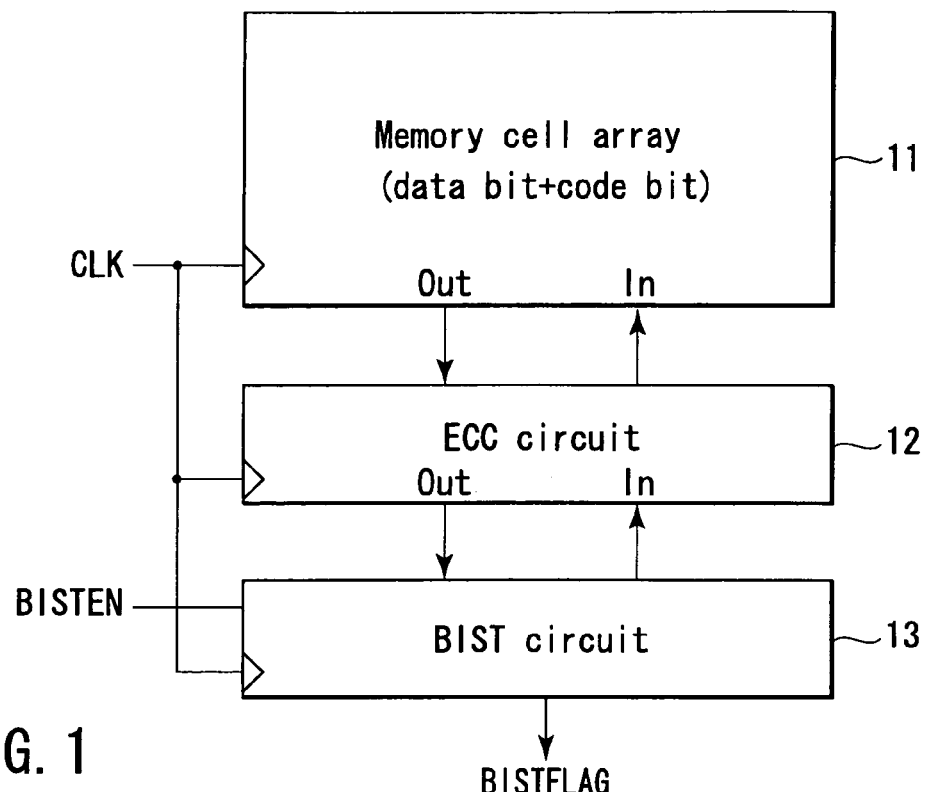
FIG. 1 is a view showing a conventional semiconductor integrated circuit.
Figure 2:
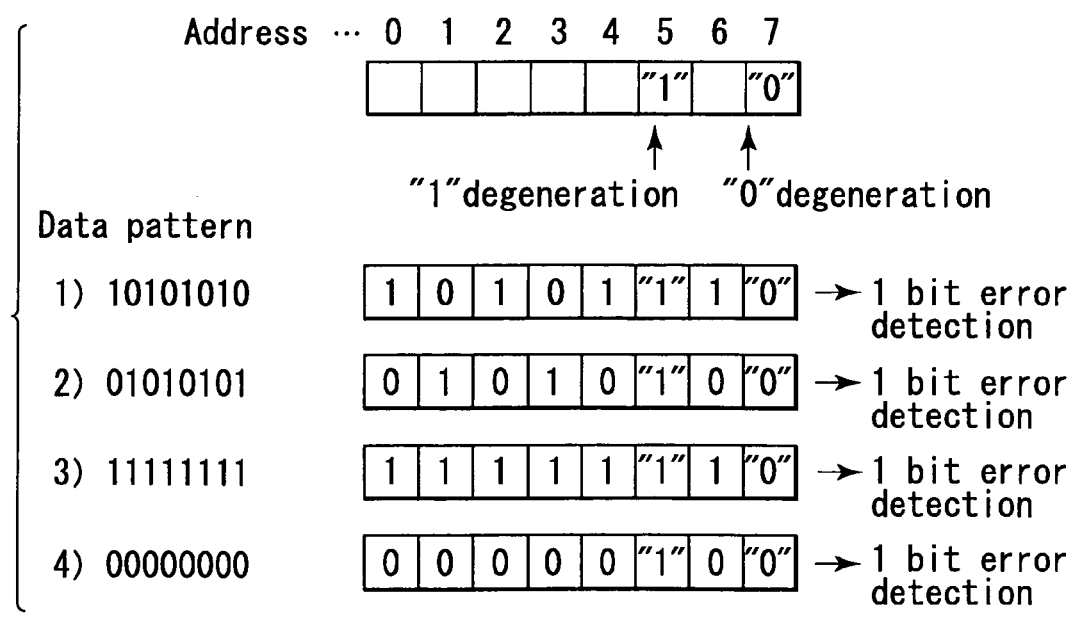
FIG. 2 is a view showing a problem in a conventional test method.
Figure 3:
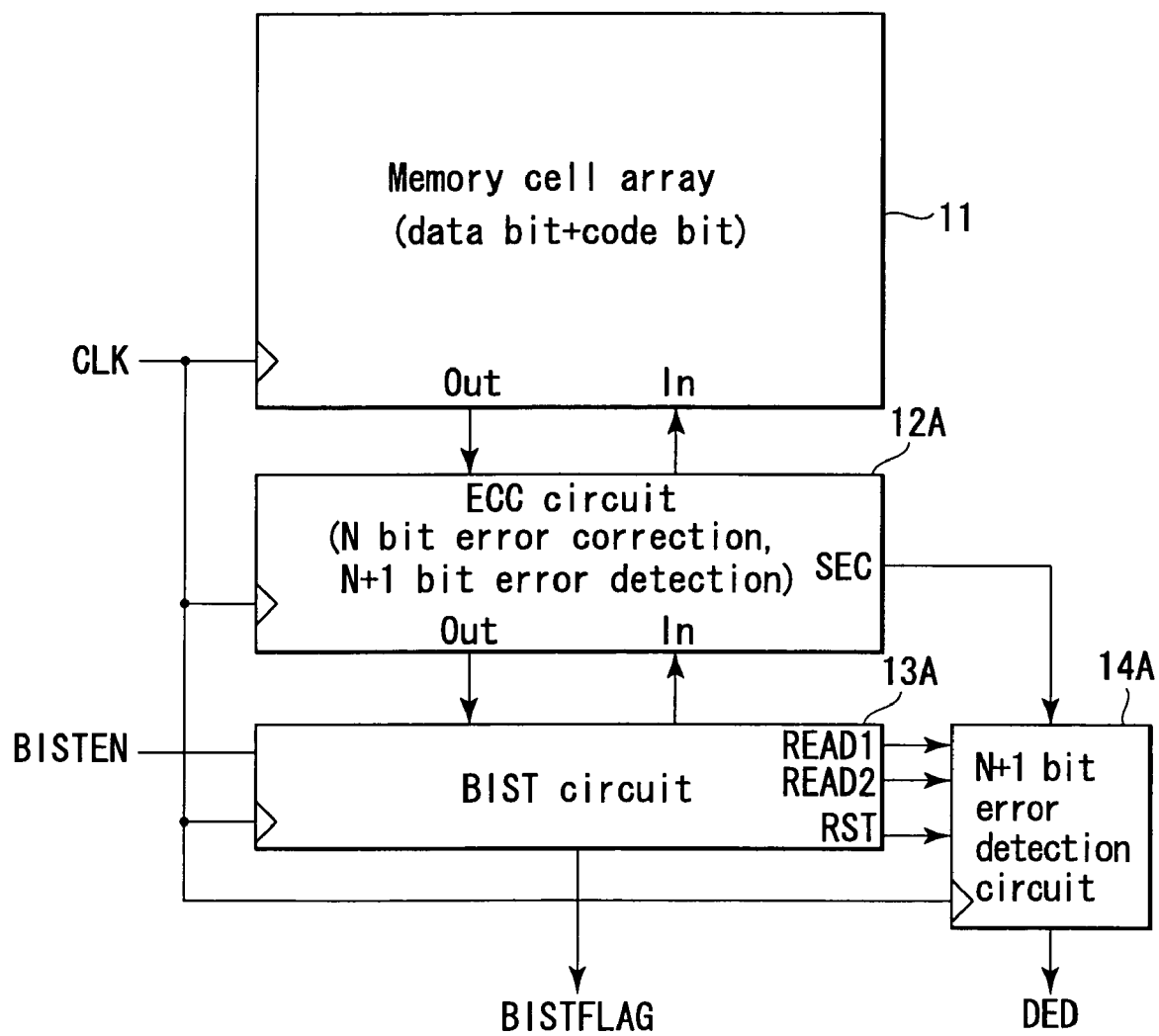
FIG. 3 is a view showing a view showing a semiconductor integrated circuit according to a first embodiment of the present invention.

FIG. 3 shows an example of the semiconductor integrated circuit according to the first embodiment of the present invention.

A memory cell array 11 stores a data bit as normal data and a code bit for error detection. During testing, the data bit is generated at, e.g., a BIST circuit 13A, and the code bit is generated at, e.g., an ECC circuit 12A based on the data bit.

Read-out data as a memory output is subjected to error correction by the ECC circuit 12A, and then transferred to the BIST circuit 13A. The ECC circuit 12A has an error correction function of N (N is a natural number) bits, and an error detection function of N+1 bits.

For example, assuming that the ECC circuit 12A has a 1-bit error correction function, even if there is a 1-bit defect (cell failure or the like) in a testing target address, the defect can be corrected. Thus, such a defect can be permitted.

That is, at the BIST circuit 13A, the read-out data that has been subjected to the error correction by the ECC circuit 12A is compared with background data (expected value). Accordingly, if there is a defect not exceeding one bit in the testing target address, both data are equal to each other, and a result of testing determines a product to be nondefective.

On the other hand, if there are defects (cell failures or the like) of two bits or more in the testing target addresses, the ECC circuit 12A that has the 1-bit error correction function cannot correct the defects. Thus, at the BIST circuit 13A, incomplete coincidence is determined between the read-out data and the background data (expected value), and a result of testing determines a product to be defective.

Now, as previously described, in the conventional test carried out by generating the marching pattern at the BIST circuit 13A, accurate detection of a defective bit in the testing target address may be impossible. In such a case, there is a problem that a defective product may be determined as nondefective.

Thus, according to the example of the invention, an N+1 bit error detection circuit 14A is newly disposed to solve the aforementioned problem. The N+1 bit error detection circuit 14A has a function of surely detecting an error that exceeds an error correction capability (N bits) of the ECC circuit 12A.

Basic units of a marching operation are (1) reading of the background data, and (2) writing/reading of inverted data of the background data.

READ 1 is a signal set in an enabled state (e.g., "H") during the reading of the background data. READ 2 is a signal set in an enabled state (e.g., "H") during the reading of the inverted data of the background data.

When one of the READ 1 and the READ 2 is at "H", data is read out of the testing target address of the memory cell array 11, and subjected to error detection/correction by the ECC circuit 12A. SEC output from the ECC circuit 12A represents the error bit numbers n1, n2 that have been subjected to error detection/correction by the ECC circuit 12A.

For example, when the READ 1 is set in an enabled state and the background data is read out of the memory cell array 11, if n1-bit error correction is executed at the ECC circuit 12A, information thereof is fetched as SEC in the N+1 bit error detection circuit 14A.

Similarly, when the READ 2 is set in an enabled state and the inverted data of the background data is read out of the memory cell array 11, if n2-bit error correction is executed at the ECC circuit 12A, information thereof is fetched as SEC in the N+1 bit error detection circuit 14A.

The N+1 bit error detection circuit 14A outputs a signal DED indicative of test NG (defective product) when a total of the bit numbers n1 and n2 subjected to error detection/correction by the ECC circuit 12A exceeds N, i.e., N+1 or more.

RST is a signal for resetting a state of the N+1 bit error detection circuit 14A when the BIST circuit 13A starts testing of the memory cell array 11.

Figure 4:
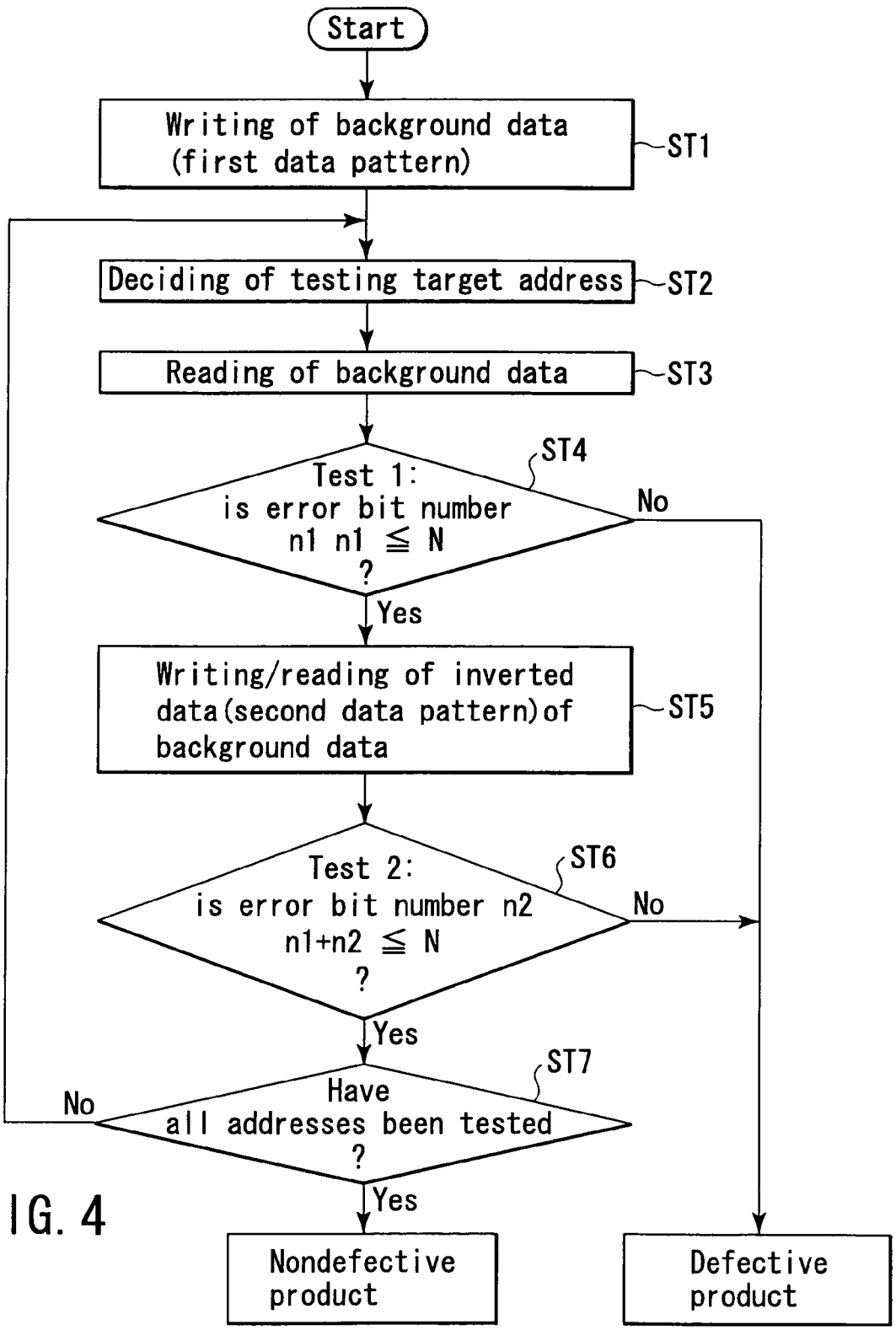
FIG. 4 is a view showing an outline (test method 1) of an operation of the circuit of FIG. 3.

FIG. 4 shows an operation (test method 1) of the semiconductor integrated circuit of FIG. 3.

It is assumed that an ECC circuit that has an error correction function of N bits and an error detection function of N+1 bits is utilized in a memory to be tested.

To begin with, background data, e.g., [1010 . . . ], is written in all the addresses of the memory (step ST1).

Next, a testing target address (first address) is decided, and bit data (background data) is read out of the testing target address (steps ST2, ST3).

Subsequently, the error bit number n1 is detected as a test 1.

That is, if there is an error n1 of N bits or less in the testing target address, the ECC circuit detects/corrects the error, and outputs a signal SEC indicative of "n1". If there is an error n1 of N+1 bits or more in the testing target address, the ECC circuit detects and reports the error to the BIST circuit (step ST4).

Next, inverted data of the background data is written/read in/from the testing target address (step ST5).

Subsequently, an error bit number n2 is detected as a test 2.

That is, if there is an error n2 of N bits or less in the testing target address, the ECC circuit detects/corrects the error, and outputs a signal SEC indicative of "n2". If a total of n1+n2 exceeds N, the N+1 bit error detection circuit determines test NG (defective product) even if neither of n1 and n2 exceeds N.

Additionally, if there is an error n2 of N+1 bits or more in the testing target address, the ECC circuit detects and reports the error to the BIST circuit (step ST6).

Next, if a total of n1+n2 is N or less, checking is made as to whether all the addresses in the memory have been tested or not (step ST7).

If all the addresses in the memory have not been tested, the testing target address is changed to execute the tests 1 and 2 again. If all the addresses in the memory have been tested, test OK (nondefective product) is determined to finish the testing.

According to the described test method, if the ECC circuit embedded memory is tested by the marching pattern, it is possible to improve defect detection accuracy by the test circuit without any increases in complexity and area of the test circuit, testing time or the like.

Next, an example of the N+1 bit error detection circuit will be described.

Figure 5:
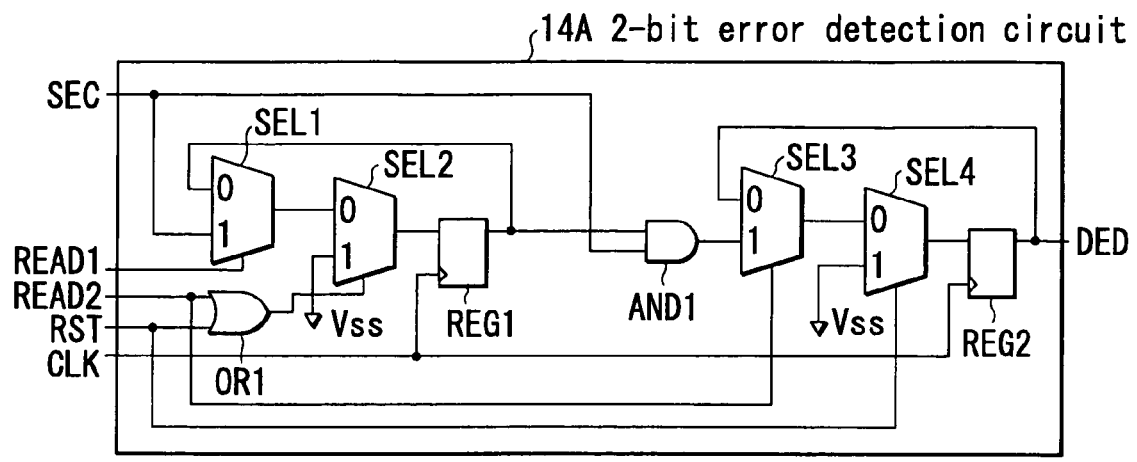
FIG. 5 is a view showing an example of an error detection circuit.
Figure 6:
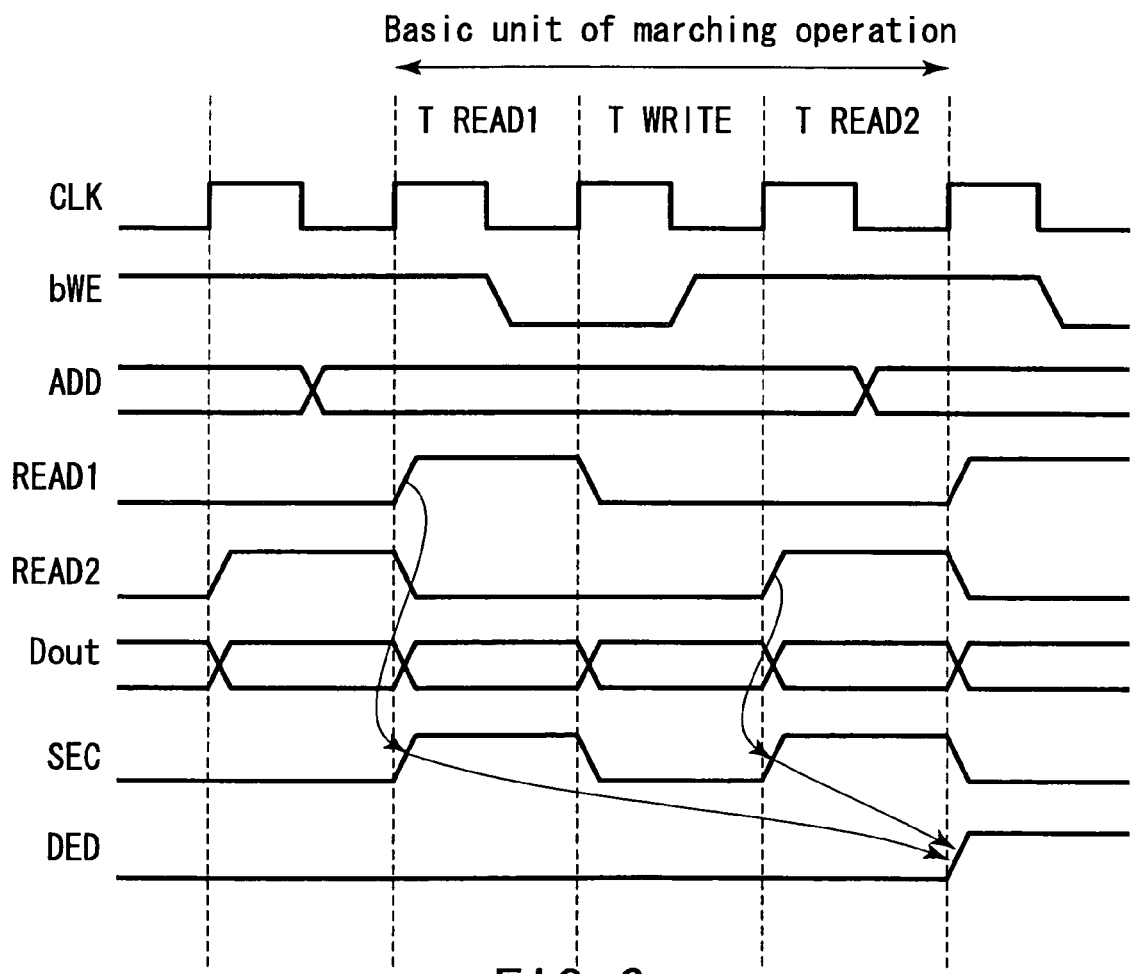
FIG. 6 is a signal waveform chart showing the operation of the circuit of FIG. 3.

FIG. 5 shows an example of a 2-bit error detection circuit. FIG. 6 shows an operation waveform of the circuit of FIG. 5.

The 2-bit error detection circuit 14A is used when the memory on which the ECC circuit having the 1-bit error correction function and the 2-bit error detection function is utilized is tested.

This circuit comprises front and rear stage sections.

The front stage section includes selectors SEL 1, SEL 2, a register REG 1, and an OR circuit OR 1, and has a function of storing an error bit number n1 (e.g., 1) detected by the ECC circuit during reading of the background data (during first reading). That is, when a 1-bit error is discovered in the testing target address, information indicative of the detection of the 1-bit error is stored in the register REG 1.

The rear stage section includes selectors SEL 3, SEL 4, a register REG 2, and an AND circuit AND 1, and has a function of obtaining a total of the error bit number n1 stored in the register REG 1 of the front stage section and an error bit number n2 (e.g., 1) detected by the ECC circuit during reading of inverted data of the background data (during second reading), and determining whether the total exceeds an error correction capability N (e.g., 1) of the ECC circuit or not. That is, if the total of the error bit numbers n1 and n2 exceeds the error correction capability N of the ECC circuit, a signal indicative of the same is stored in the register REG 2.

A specific operation will be described.

At the start of testing, first, RST becomes "H" to initialize states of the registers REG 1 and REG 2 of the front and rear stage sections. That is, when RST becomes "H", the selectors SEL 2, SEL 4 are set in states of selecting and outputting input signals of a "1" side, and thus output signals thereof become "L (=Vss)".

Accordingly, "L" is stored in each of the registers REG 1, REG 2, and an output signal DED of the 2-bit error detection circuit 14A becomes "L".

Subsequently, when RST becomes "L", the selectors SEL 2, SEL 4 are set in states of selecting and outputting input signals of a "0" side.

During reading of the background data (first reading time T READ 1), READ 1 becomes "H" to read data of a testing target address ADD as Dout. At this time, the selector SEL 1 is set in a state of selecting and outputting an input signal of a "1" side. Accordingly, when 1-bit error correction is executed at the ECC circuit, SEC becomes "H", and "H" is stored in the register REG 1.

Subsequently, a writing signal WE becomes "H", and an inverted signal bWE thereof becomes "L". The inverted data of the background data is written for the testing target address ADD (T WRITE).

During reading of the inverted data of the background data (second reading time), READ 2 becomes "H" to read data of the testing target address ADD as Dout. At this time, the selector SEL 3 is set in a state of selecting and outputting an input signal of a "1" side. Accordingly, when 1-bit error correction is executed at the ECC circuit, SEC becomes "H".

Here, if "L" has been stored in the register REG 1 of the front stage section, since an output signal of the AND circuit AND 1 becomes "L", "L" is kept stored in the register REG 2. That is, the output signal DED of the 2-bit error detection circuit 14A is maintained at "L".

On the other hand, if "H" has been stored in the register REG 1 of the front stage section, since an output signal of the AND circuit AND 1 becomes "H", "H" is stored in the register REG 2. That is, the output signal DED of the 2-bit error detection circuit 14A becomes "H".

Incidentally, when READ 2 becomes "H", an output signal of the OR circuit OR 1 of the front stage section becomes "H", and the selector SEL 2 is set in a state of selecting and outputting an input signal of a "1" side. That is, at this time, the state of the register REG 1 of the front stage section can be reset to prepare for a next marching operation.

Thus, according to the example of the invention, regarding the test method that uses the marching pattern, test NG (defective product) is determined if a total of the number of error bits (e.g., 1 bit) generated during the first reading time T READ 1 and the number of error bits (e.g., 1 bit) generated during the second reading time T READ 2 exceeds the error correction capability (e.g., 1 bit) of the ECC circuit.

Figure 7:
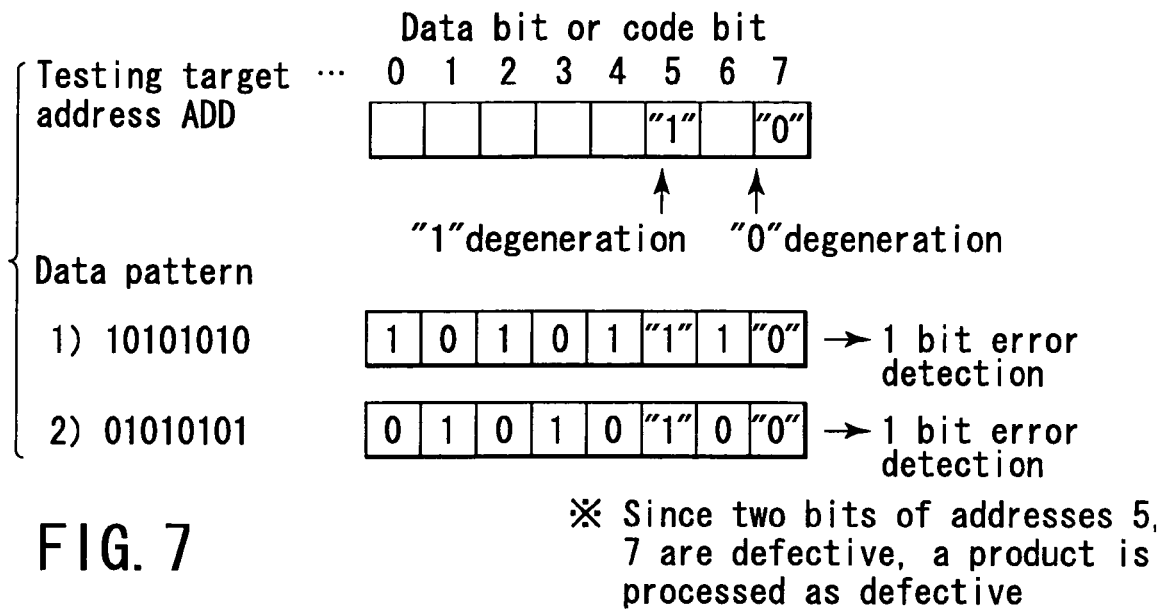
FIG. 7 is a view showing a specific example of the test method 1.

Generally, as shown in FIG. 7, assuming that causes of bit errors are Stack-at-faults (degeneration failures) of the cell, if the memory is tested by writing/reading complementary data ("0", "1") with respect to the same address as in the case of the marching pattern, a sum total of Stack-at-faults becomes a total of the number of bit errors generated by writing/reading "0" data and the number of bit errors generated by writing/reading "1" data.

Therefore, it is possible to surely detect all defects in the testing target addresses if the result of testing (nondefective/defective product) is determined based on the total of the number of error bits generated during the first reading time T READ 1 and the number of error bits generated during the second reading time T READ 2.

As described above, according to the example of the present invention, it is possible to improve defect detection accuracy by the test circuit without any increases in complexity and area of the test circuit, testing time or the like.

3. Second Embodiment

Next, a semiconductor integrated circuit according to a second embodiment of the present invention will be described.

According to the first embodiment, defectiveness/nondefectiveness of the product is determined by detecting the error bit numbers n1, n2 on the assumption that the writing/reading (test 1, test 2) of the complementary data ("0", "1") is executed with respect to the testing target address.

However, (1) if since only a part (e.g., 4 bits) of data bits (e.g., 8 bits) is used, only this part is tested, or (2) if code bits are tested, direct application of the first embodiment may cause inconveniences.

For example, even in the case of testing only a part (e.g., 4 bits) of the data bits (e.g., 8 bits), the testing target address may contain all the data bits (8 bits). In this case, a part (4 bits) of the data bits is tested by writing/reading the complementary data. However, for the remaining bits (4 bits), writing/reading of the same data is executed.

Consequently, if there is a Stack-at-fault in one of the remaining bits (4 bits) for which the writing/reading of the same data is executed, bit errors are detected in both of the tests 1 and 2, and a 2-bit error is determined while it is in fact a 1-bit error.

Additionally, for example, even in the case of testing the data bits and the code bits, a value of the code bits is decided based on a value of the data bits. Thus, even if the data bits are tested by writing/reading the complementary data, writing/reading of not the complementary data but the same data may be executed for a part of the code bits.

Consequently, if there is a Stack-at-fault in one of a part of the code bits for which the writing/reading of the same data is executed, bit errors are detected in both of the tests 1 and 2, and a 2-bit error is determined while it is in fact a 1-bit error.

Thus, the second embodiment provides a technology for accurately detecting defects such as Stack-at-faults even in the case of writing/reading the same data for a part of the testing target addressee while testing is carried out by writing/reading the complimentary data ("0", "1") for the testing target addresses in principle.

Figure 8:
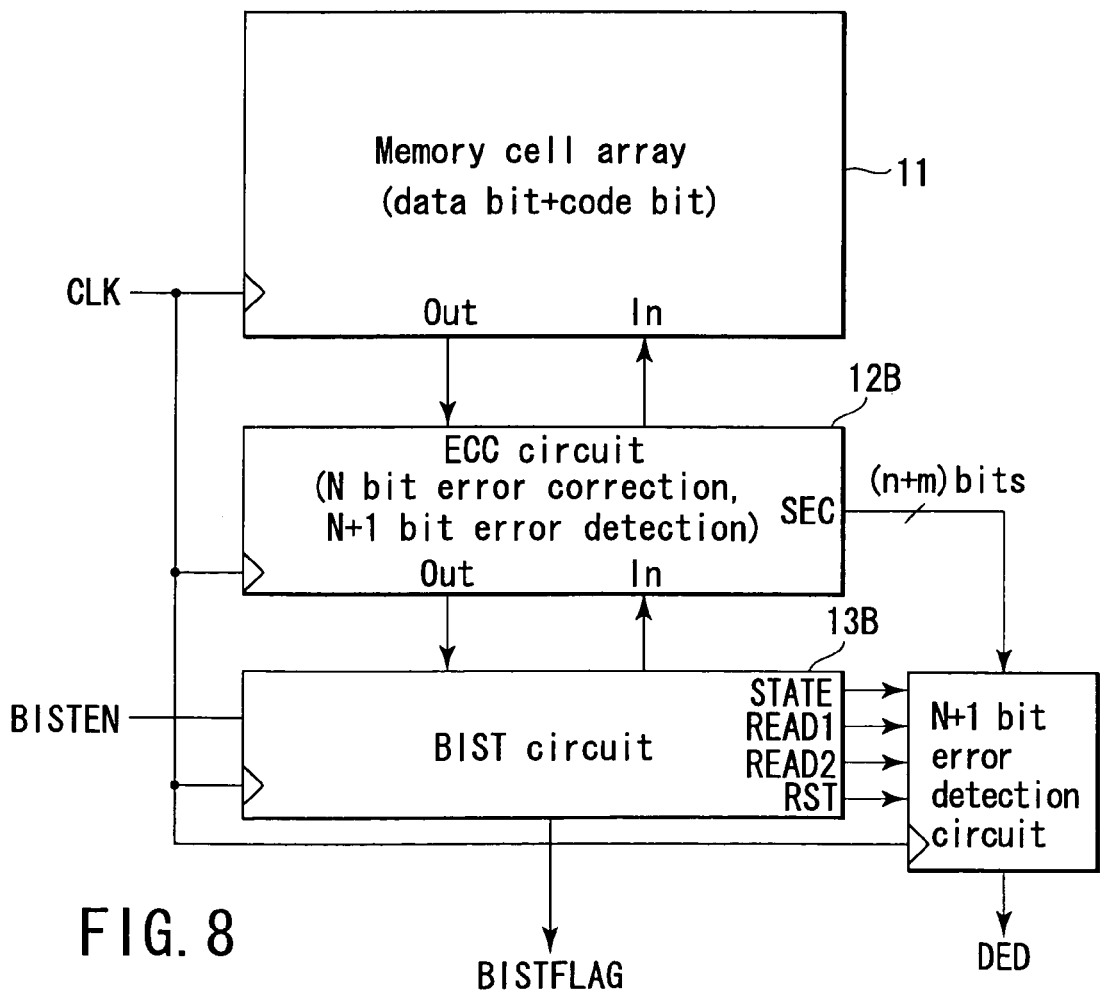
FIG. 8 is a view showing a semiconductor integrated circuit according to a second embodiment of the present invention.

FIG. 8 shows an example of the semiconductor integrated circuit according to the second embodiment of the present invention.

A memory cell array 11 stores a data bit as normal data and a code bit for error detection. During testing, the data bit is generated at, e.g., a BIST circuit 13B, and the code bit is generated at, e.g., an ECC circuit 12B based on the data bit.

Read-out data as a memory output is subjected to error correction by the ECC circuit 12B, and then transferred to the BIST circuit 13B. The ECC circuit 12B has an error correction function of N (N is a natural number) bits, and an error detection function of N+1 bits.

Now, in the case of the first embodiment, when the memory is tested by generating the marching pattern at the BIST circuit 13B, if the same data is always written/read for a part of the testing target addresses, a 2-bit error may be determined while it is in fact a 1-bit error. Thus, there is a problem that a nondefective product may be determined as defective.

Thus, according to the second embodiment, an improved N+1 bit error detection circuit 14B is disposed to solve the aforementioned problem. The N+1 bit error detection circuit 14B has a function of accurately and surely detecting bit errors that exceed an error correction capability (N bits) of the ECC circuit 12B.

READ 1 is a signal set in an enabled state (e.g., "H") during reading of background data. READ 2 is a signal set in an enabled state (e.g., "H") during reading of inverted data of the background data.

When one of the READ 1 and the READ 2 is at "H", data is read out of the testing target address of the memory cell array 11, and subjected to error detection/correction by the ECC circuit 12B.

STATE represents a data pattern written in the testing target address.

For example, when the READ 1 is in an enabled state, STATE represents background data. When the READ 2 is in an enabled state, STATE represents data written in the testing target address, i.e., inverted data of the background data or data similar to the background data, in T WRITE step (see FIG. 6).

By checking the STATE, in a test 2, it is possible to identify a bit in which the inverted data has been written and a bit in which the same data has been written in the testing target address.

SEC output from the ECC circuit 12B is a signal that indicates presence of an error for each of the bits (e.g., n bits of data bits+m bits of code bits) of the testing target address, and can specify error bits.

For example, when the READ 1 is set in an enabled state and the background data is read out of the memory cell array 11, if error correction is executed for bits of a particular address (e.g., address 5) at the ECC circuit 12B, information thereof is fetched as SEC in the N+1 bit error detection circuit 14B.

Similarly, when the READ 2 is set in an enabled state and inverted data of the background data or data similar to the background data is read out of the memory cell array 11, if error correction is executed for bits of a particular address (e.g., address 5) at the ECC circuit 12B, information thereof is fetched as SEC in the N+1 bit error detection circuit 14B.

The N+1 bit error detection circuit 14B detects the error bit number n1 in the test 1. Additionally, in the test 2, the N+1 bit error detection circuit 14B first specifies a bit to be determined for presence of a bit error, i.e., a bit to be checked, in the testing target address based on STATE.

Subsequently, the N+1 bit error detection circuit 14B obtains the error bit number n2 based on an SEC signal for the bit to be checked.

Then, a signal DED indicative of test NG (defective product) is output when a total of the bit numbers n1 and n2 exceeds N, i.e., N+1 or more.

RST is a signal for resetting a state of the N+1 bit error detection circuit 14B when the BIST circuit 13B starts testing of the memory cell array 11.

Figure 9:
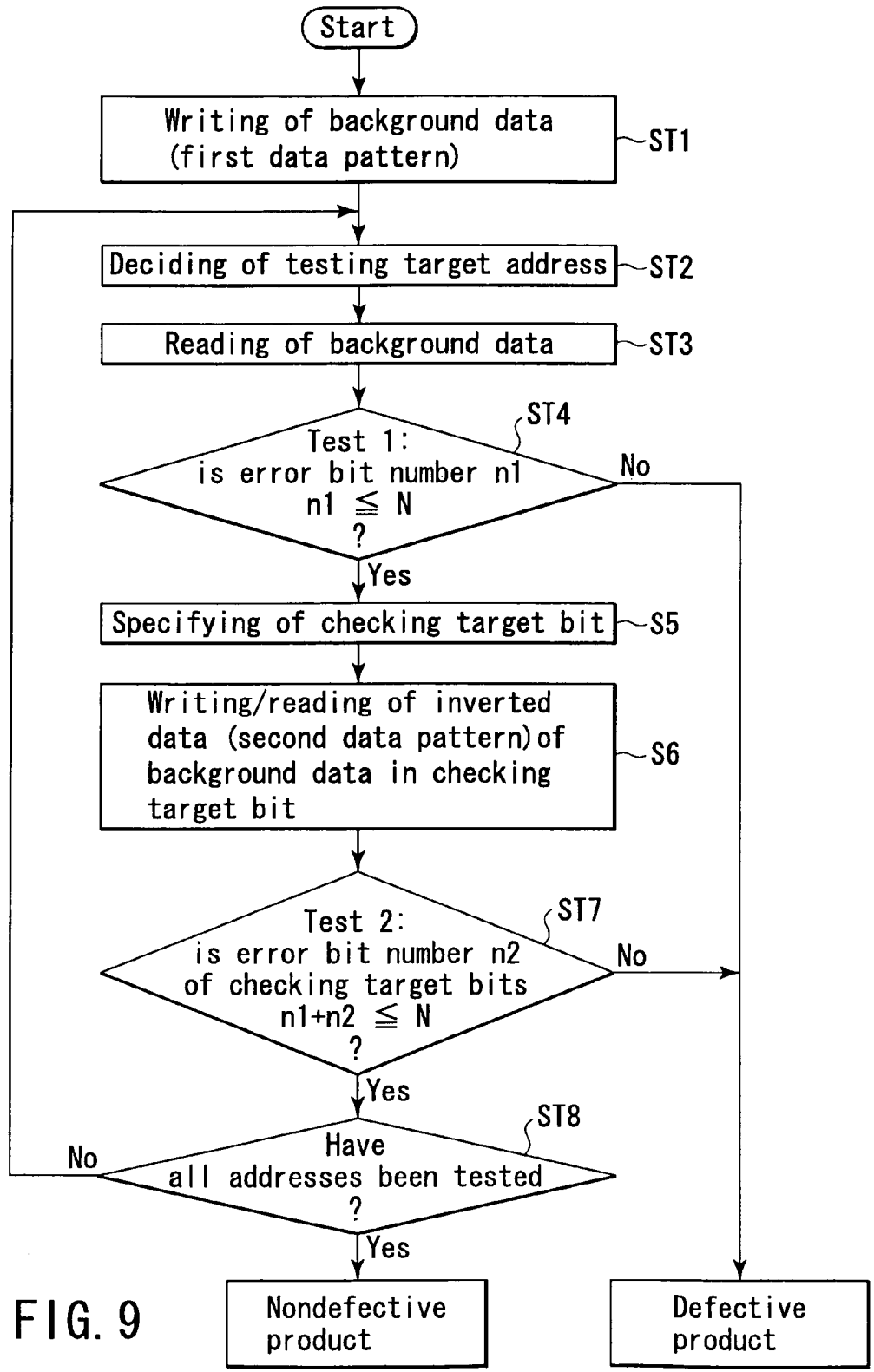
FIG. 9 is a view showing an outline (test method 2) of an operation of the circuit of FIG. 8.

FIG. 9 shows an operation (test method 2) of the semiconductor integrated circuit of FIG. 8.

It is assumed that an ECC circuit that has an error correction function of N bits and an error detection function of N+1 bits is utilized in a memory to be tested.

To begin with, background data, e.g., [1010 . . . ], is written in all the addresses of the memory (step ST1).

Next, a testing target address (first address) is decided, and bit data (background data) is read out of the testing target address (steps ST2, ST3).

Subsequently, an error bit number n1 is detected as a test 1.

That is, if there is an error n1 of N bits or less in the testing target address, the ECC circuit detects/corrects the error, and outputs an SEC signal indicative of presence of an error for each bit of the testing target address. The N+1 bit error detection circuit obtains n1 based on the SEC signal.

Additionally, if there is an error n1 of N+1 bits or more in the testing target address, the ECC circuit detects and reports the error to the BIST circuit (step ST4).

Next, a bit to be checked is specified (step ST5).

That is, among bits of the testing target address, only a bit in which inverted data of the background data is written is set for calculation of an error bit number n2 in the test 2 (bit to be checked), while a bit in which data similar to the background data is written is not set for calculation of the number b2 of error bits in the test 2.

Next, the inverted data of the background data is written/read for the bit to be checked (step ST6).

Subsequently, the error bit number n2 is detected as a test 2.

That is, if there is an error n2 of N bits or less in the testing target address, the ECC circuit detects/corrects the error, and outputs an SEC signal indicative of presence of an error for each bit of the testing target address. The N+1 bit error detection circuit detects the error bit number n2 based on the SEC signal for the bit to be checked.

Then, if a total of n1+n2 exceeds N, the N+1 bit error detection circuit determines test NG (defective product) even if neither of n1 and n2 exceeds N.

Additionally, if there is an error n2 of N+1 bits or more in the testing target address, the ECC circuit detects and reports the error to the BIST circuit (step ST7).

Next, if a total of n1+n2 is N or less, checking is made as to whether all the addresses in the memory have been tested or not (step ST8).

If all the addresses in the memory have not been tested, the testing target address is changed to execute the tests 1 and 2 again. If all the addresses in the memory have been tested, test OK (nondefective product) is determined to finish the testing.

According to the described test method, if the ECC circuit embedded memory is tested by the marching pattern, it is possible to improve defect detection accuracy by the test circuit without any increases in complexity and area of the test circuit, testing time or the like.

Each of FIGS. 10 and 11 shows an example of specifying a bit to be checked.

To begin with, consideration is given to a case in which data bits (n bits) and code bits (m bits) are set to be tested and, for example, a repeated data pattern of "1010 . . . " is written as background data.

In this case, as shown in FIG. 10, in the test 1, all the bits of testing target addresses 0, 1, . . . 7, a, b, . . . e are targeted to obtain "n1".

Subsequently, if inverted data "0101 . . . " of the background data is written in the data bits, the inverted data is written in the addresses c, d of the code bits while the same data is written in the addresses a, b, e of the code bits.

Accordingly, since the inclusion of the addresses a, b, e of the code bits in the target of the test 2 has a risk of detecting a 1-bit error as a 2-bit error, the addresses a, b, e are not targeted for the test 2.

That is, in the test 2, among the testing target addresses, all the addresses 0, 1, . . . 7 of the data bits and only the specific addresses c, d of the code bits are targeted (bits to be checked) to obtain "n2".

Next, since only a part of the data bits (n bits) is used, consideration is given to a case of testing only this part. It is assumed that a repeated data pattern of "1010 . . . " is written as background data in a part of the data bits.

In this case, as shown in FIG. 11, in the test 1, a part of the data bits, i.e., the bits of the addresses 0, 1, 2, 3, is targeted to obtain "n1".

Subsequently, inverted data "0101 . . . " of the background data is written in a part of the data bits.

Then, in the test 2, a part of the data bits, i.e., the bits of the 0, 1, 2, 3, is targeted again to obtain "n2".

Here, since the same data is written in the addresses 4, 5, 6, 7 in the tests 1 and 2, if the bits of these addresses are set to be tested, there is a risk of detecting a 1-bit error as a 2-bit error. Thus, the bits of these addresses are not set to be tested.

Figure 12:
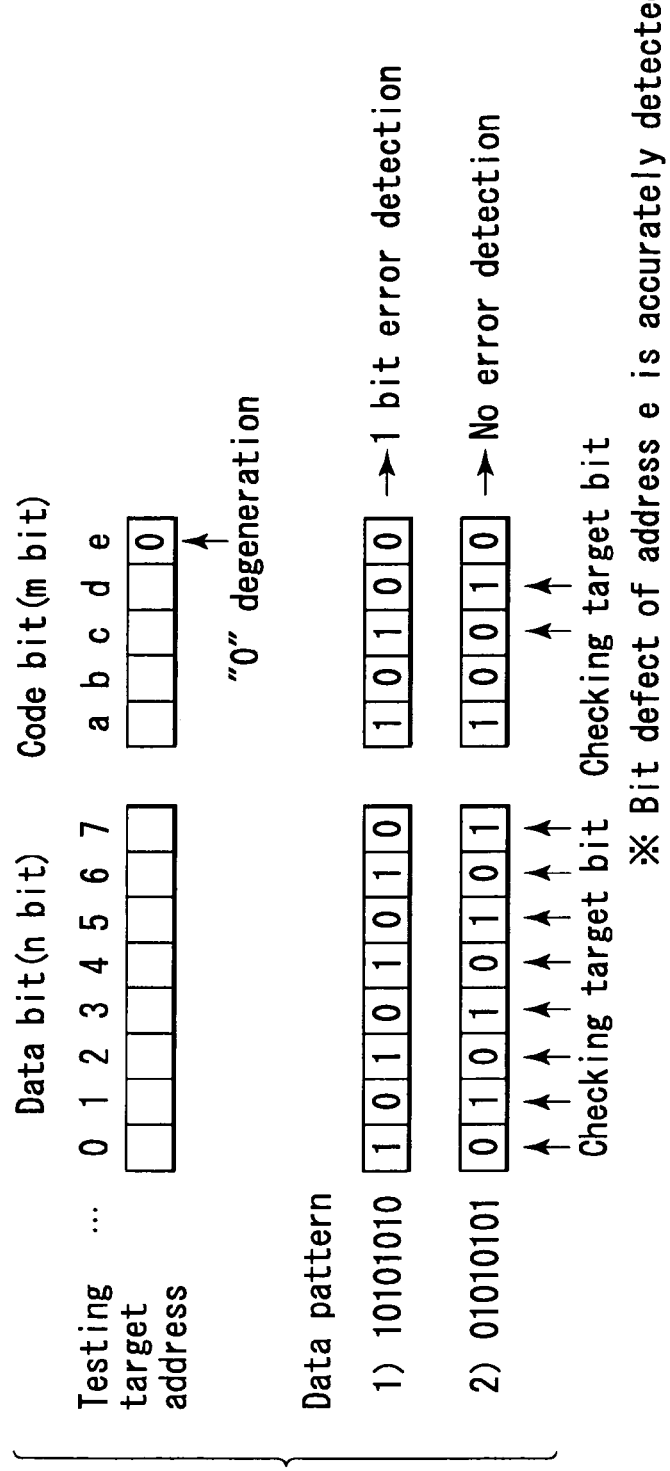
FIG. 12 is a view showing effects of the test method 2.

FIG. 12 shows effects of the test method 2.

It is assumed that data bits (n bits) and code bits (m bits) are set to be tested and, for example, a Stack-at-zero fault is generated in the address e of the code bits. Background data is a repeated pattern of "1010 . . . ".

In this case, in the test 1, presence of a bit error in the address e of the codes bits among the testing target addresses 0, 1, . . . 7, a, b, . . . e is detected.

Subsequently, inverted data "0101 . . . " of the background data is written in the data bits. At this time, "10011" is written in the addresses a, b, c, d, e of the code bits. That is, since the inverted data is written in the addresses c, d of the code bits, the addresses c, d are set to be checked. However, since the same data is written in the addresses a, b, e of the code bits, the addresses a, b, e are not set to be checked.

Accordingly, in the test 2, since no bit error is detected again in the address e of the code bits, it is possible to prevent repeated detection of a 1-bit error.

Thus, according to the example of the present invention, regarding the test method that uses the marching pattern, the address in which not the complementary data but the same data is written is not set as a target (bit to be checked) when the error bit number n2 is obtained in the test 2.

Therefore, it is possible to accurately and surely detect defects in the testing target addresses if the result of testing (nondefective/defective product) is determined based on the total of the error bit numbers n1 and n2.

As described above, according to the example of the present invention, it is possible to improve defect detection accuracy by the test circuit without any increases in complexity and area of the test circuit, testing time or the like.

4. Others

According to the example of the present invention, the memory to be tested may be a nonvolatile memory such as a flash memory, FeRAM or MRAM in addition to DRAM and SRAM.

Figure 13:
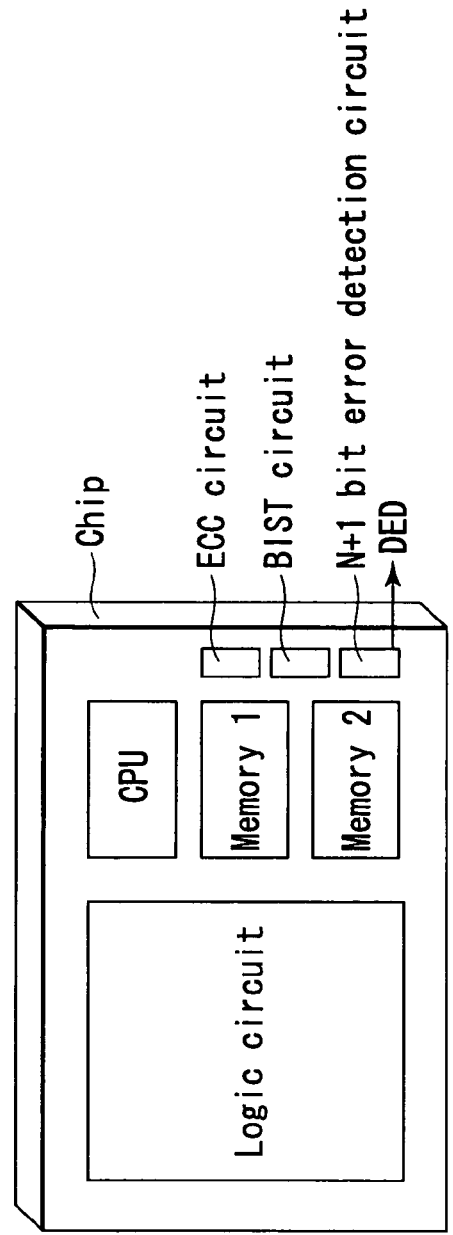
FIG. 13 is a view showing an outline of a system LSI to which an example of the present invention is applied.

For example, as shown in FIG. 13, the example of the present invention can be applied to testing of memories 1, 2 in a system LSI that includes a plurality of functional blocks (CPU, logic circuit, memories 1, 2 etc.).

According to the foregoing embodiments, the BIST circuit may be formed in a chip in which the memory cell array to be tested is arranged, or in a different chip. Additionally, the BIST circuit may be omitted, and the memory cell array may be tested by using an external tester.

Furthermore, the ECC circuit that has the error correction function of N bits and the error detection function of N+1 bits has been described. According to the example of the present invention, however, it is not always necessary for the ECC circuit to have the error detection function of N+1 bits. For example, the example of the invention can be applied to a case in which the ECC circuit has only the error correction function of N bits.

The example of the present invention is applied to the BIST circuit for testing the memory on which the ECC circuit is utilized, and mainly effective for the system LSI that has a plurality of functional blocks including a memory such as DRAM or SRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor integrated circuit comprising:
    a memory;
    an ECC circuit that has an error correction function of N (N is a natural number) bits for output data of the memory;
    an error detection circuit configured to output a signal indicative of the following fact, if a total of an error bit number n1 detected by the ECC circuit when a first data pattern in testing target addresses of the memory is read out and an error bit number n2 detected by the ECC circuit when a second data pattern that is an inversion of the first data pattern in at least a part of the testing target addresses is read out exceeds N; and
    a BIST circuit configured to read the first data pattern out of the testing target addresses of the memory as a first operation,
    write the second pattern in at least a part of the testing target addresses as a second operation, and
    read out the written second data pattern,
    wherein the first data pattern has been corrected by the ECC circuit and is input to the BIST circuit.

2. The semiconductor integrated circuit according to claim 1,
    wherein the BIST circuit repeats the first and second operations while changing the testing target addresses.

3. The semiconductor integrated circuit according to claim 2,
    wherein the BIST circuit writes the first data pattern as background data in all the addresses of the memory before the first and second operations are repeated.

4. The semiconductor integrated circuit according to claim 1, wherein:
    the ECC circuit outputs SEC signals indicative of the error bit numbers n1 and n2;
    the BIST circuit outputs a first reading signal during reading of the first data pattern, and a second reading signal during reading of the second data pattern; and
    the error detection circuit stores the error bit number n1 upon reception of the first reading signal, and the error bit number n2 upon reception of the second reading signal, and calculates n1+n2 by logic processing.

5. The semiconductor integrated circuit according to claim 4,
wherein the error bit numbers n1 and n2 are stored in registers.

6. The semiconductor integrated circuit according to claim 1,
wherein the error detection circuit sets only a bit among bits of the testing target addresses in which the second data pattern has been written to be checked, and counts in the error bit number n2 for an error generated in the bit to be checked.

7. The semiconductor integrated circuit according to claim 6,
wherein the testing target addresses contain data bits and code bits, and bits other than the bit to be checked are parts of the data bits.

8. The semiconductor integrated circuit according to claim 6,
wherein the testing target addresses contain data bits and code bits, and bits other than the bit to be checked are parts of the code bits.

9. The semiconductor integrated circuit according to claim 6, wherein:
the ECC circuit outputs an SEC signal indicative of presence of an error to each of the bits of the testing target addresses;
the BIST circuit outputs a state signal indicative of the first and second test patterns; and
the error detection circuit specifies the bit to be checked based on the state signal, and obtains the error bit number n2 for the bit to be checked based on the SEC signal.

10. The semiconductor integrated circuit according to claim 9, wherein the semiconductor integrated circuit constitutes a part of a system LSI.

11. The semiconductor integrated circuit according to claim 1,
wherein the N is 1.

12. A test method of a semiconductor memory with an ECC circuit comprising:

reading a first data pattern out of testing target addresses of a memory;
detecting an error bit number n1 by using the ECC circuit that has an error correction function of N (N is a natural number) bits;
writing/reading a second data pattern that is an inversion of the first data pattern in at least a part of the testing target addresses;
detecting an error bit number n2 by using the ECC circuit; and
determining whether a total of the error bit numbers n1 and n2 exceeds N or not.

13. The test method according to claim 12,
wherein after the first data pattern is written as background data in all the addresses of the memory, the reading of the first data pattern and the writing/reading of the second data pattern are repeated while the testing target addresses are changed.

14. The test method according to claim 12,
wherein the error bit numbers n1 and n2 are stored in registers.

15. The test method according to claim 12, wherein only a bit among the bits of the testing target addresses in which the second data pattern has been written is set to be checked, and the error bit number n2 is counted in for an error generated in the bit to be checked.

16. The test method according to claim 15, wherein the ECC circuit determines presence of an error for each of the bits of the testing target addresses.

17. The test method according to claim 15, wherein the bit to be checked is specified based on the first and second data patterns.

18. The test method according to claim 12, wherein the first and second data patterns are generated in a chip.

19. The test method according to claim 12, wherein the semiconductor integrated circuit is determined to be a defective product when a total of the error bit numbers n1 and n2 exceeds N.

* * * * *